(12) United States Patent
Matsuzawa

(10) Patent No.: US 9,891,125 B2
(45) Date of Patent: Feb. 13, 2018

(54) ELECTRONIC DEVICE, PHYSICAL QUANTITY SENSOR, PRESSURE SENSOR, VIBRATOR, ALTIMETER, ELECTRONIC APPARATUS, AND MOVING OBJECT

(71) Applicant: Seiko Epson Corporation, Tokyo (JP)

(72) Inventor: Yusuke Matsuzawa, Chino (JP)

(73) Assignee: Seiko Epson Corporation (JP)

( * ) Notice: Subject to any disclaimer, the term of this patent is extended or adjusted under 35 U.S.C. 154(b) by 135 days.

(21) Appl. No.: 14/952,042

(22) Filed: Nov. 25, 2015

(65) Prior Publication Data
US 2016/0153857 A1 Jun. 2, 2016

(30) Foreign Application Priority Data
Nov. 28, 2014 (JP) .................. 2014-241796

(51) Int. Cl.
*G01L 9/06* (2006.01)
*G01L 9/00* (2006.01)
*B81B 3/00* (2006.01)
*B81B 7/04* (2006.01)

(52) U.S. Cl.
CPC ............ *G01L 9/0054* (2013.01); *B81B 3/00* (2013.01); *B81B 7/04* (2013.01)

(58) Field of Classification Search
None
See application file for complete search history.

(56) References Cited

U.S. PATENT DOCUMENTS

| 4,838,088 A * | 6/1989 | Murakami | B81B 3/0021 |
| | | | 361/283.4 |
| 7,709,912 B2 | 5/2010 | Sato et al. | |
| 7,880,245 B2 | 2/2011 | Sato et al. | |
| 8,410,561 B2 | 4/2013 | Sato et al. | |
| 2015/0268114 A1 * | 9/2015 | Takeuchi | G01L 9/0054 |
| | | | 73/384 |
| 2016/0137494 A1 * | 5/2016 | Tanaka | B81C 1/00293 |
| | | | 257/419 |
| 2016/0138989 A1 * | 5/2016 | Tanaka | G01L 9/0054 |
| | | | 73/384 |

(Continued)

FOREIGN PATENT DOCUMENTS

| JP | 2005-283354 A | 10/2005 |
| JP | 2008-114354 A | 5/2008 |
| JP | 2011-164057 A | 8/2011 |

*Primary Examiner* — Andre Allen
(74) *Attorney, Agent, or Firm* — Harness, Dickey & Pierce, P.L.C.

(57) ABSTRACT

A physical quantity sensor includes a substrate, a piezoresistive element that is arranged on one face side of the substrate, a wall portion that is arranged to surround the piezoresistive element on the one face side of the substrate in a plan view of the substrate, and a ceiling portion that constitutes a cavity portion with the wall portion, in which the ceiling portion includes a cladding layer that has a pore which passes therethrough in the thickness direction of the cladding layer, and a seal layer that is stacked on the opposite side of the cladding layer from the substrate and closes the pore, the seal layer in which at least a part of the outer periphery of a contact portion where the seal layer is in contact with the cladding layer is on the outside of the cavity portion in a plan view.

8 Claims, 10 Drawing Sheets

(56) References Cited

U.S. PATENT DOCUMENTS

2016/0138990 A1\* 5/2016 Tanaka .................. G01L 9/0054
 73/727
2016/0153856 A1\* 6/2016 Hayashi ................ G01L 9/0054
 73/384

\* cited by examiner

ELECTRONIC DEVICE, PHYSICAL QUANTITY SENSOR, PRESSURE SENSOR, VIBRATOR, ALTIMETER, ELECTRONIC APPARATUS, AND MOVING OBJECT

CROSS REFERENCE

This application claims the benefit of Japanese Application No. 2014-241796, filed on Nov. 28, 2014. The disclosure of the prior application is hereby incorporated by reference herein in its entirety.

BACKGROUND

1. Technical Field

The present invention relates to an electronic device, a physical quantity sensor, a pressure sensor, an altimeter, a vibrator, an electronic apparatus, and a moving object.

2. Related Art

There is known an electronic device that includes a cavity portion formed by using a semiconductor manufacturing process (for example, refer to JP-A-2008-114354). An example of such an electronic device is the electronic device that is in accordance with JP-A-2008-114354. The electronic device, as disclosed in JP-A-2008-114354, is provided with a substrate, a functional structure that constitutes a functional element formed on the substrate, and a cladding structure that defines a cavity portion in which the functional structure is arranged. The cladding structure includes a laminated structure of an interlayer insulating film and an interconnect layer that is formed on the substrate like surrounding the periphery of the cavity portion. An upper cladding portion of the cladding structure that covers the cavity portion from above includes a first cladding layer and a second cladding layer. The first cladding layer is provided with a through hole that is open to the cavity portion. The second cladding layer closes the through hole of the first cladding layer.

A protective film that includes an opening portion which exposes a region of the first cladding layer where the through hole is formed is formed on the first cladding layer, and the second cladding layer is disposed to cover the opening portion of the protective film.

In the electronic apparatus according to JP-A-2008-114354, however, since a step that is formed on the first cladding layer by the protective film is at a position where the step overlaps with the cavity portion in a plan view, stress is concentrated on the stepped part when external forces are exerted on the upper cladding portion due to thermal contraction and the like, and damage such as cracks occurs in the upper cladding portion. As a consequence, a problem arises in that the air tightness of the cavity portion decreases.

SUMMARY

An advantage of some aspects of the invention is to provide an electronic device and a physical quantity sensor having excellent reliability and to provide a pressure sensor, a vibrator, an altimeter, an electronic apparatus, and a moving object provided with the electronic device.

Such an advantage is accomplished by the following application examples.

APPLICATION EXAMPLE 1

An electronic device according to this application example includes a substrate, a functional element that is arranged on one face side of the substrate, a wall portion that is arranged to surround the functional element on the one face side of the substrate in a plan view of the substrate, and a ceiling portion that is arranged on the opposite side of the wall portion from the substrate and constitutes an inner space with the wall portion, in which the ceiling portion includes a first layer that includes a through hole, and a second layer that is stacked on the first layer on the opposite side of the first layer from the substrate and closes an opening portion of the through hole, the second layer in which at least a part of the outer periphery of a contact portion where the second layer is in contact with the first layer is on the outside of the inner space in a plan view.

According to such an electronic device, when a protective film (insulating layer) is formed on the first layer on the outside of a contact portion where the first layer is in contact with the second layer, a stepped portion that is formed on the first layer by the protective film can be arranged on the wall portion that has comparatively high rigidity. Therefore, when external forces are exerted on the ceiling portion due to thermal contraction and the like, it is possible to alleviate the concentration of stress on the stepped portion and to reduce damage such as cracks in the ceiling portion. As a consequence, it is possible to reduce the degradation of characteristics due to a decrease in the air tightness of the inner space and to improve reliability.

APPLICATION EXAMPLE 2

It is preferable that the electronic device according to the application example further includes an insulating layer that has a part which is arranged between an outer peripheral portion of the first layer and an outer peripheral portion of the second layer.

With this configuration, the insulating layer can be used as a protective film when, for example, etching is performed through the through hole of the first layer during manufacturing of the electronic device. In addition, a stepped portion is formed on the first layer by such an insulating layer. If the outer periphery of the stepped portion is on the inside of the inner space in a plan view as in the related art when the second layer is formed across the stepped portion, stress is likely to be concentrated particularly on the part of the second layer that is formed across the stepped portion. Therefore, when the application example of the invention is applied in such a case, the effect thereof becomes noticeable.

APPLICATION EXAMPLE 3

In the electronic device according to the application example, it is preferable that the ceiling portion includes a first material that is included in the wall portion, and a second material of which the thermal expansion rate is smaller than the thermal expansion rate of the first material.

With this configuration, it is possible to reduce bending of the ceiling portion due to thermal expansion while providing excellent air tightness in the ceiling portion.

APPLICATION EXAMPLE 4

In the electronic device according to the application example, it is preferable that the inner periphery of an end portion of the wall portion that is on the ceiling portion side of the wall portion includes a corner portion, and at least apart of the outer periphery of the contact portion that corresponds to the corner portion is arranged on the outside of the inner space in a plan view.

When the inner periphery of the ceiling portion-side end portion of the wall portion includes the corner portion, if the outer periphery of the stepped portion is on the inside of the inner space in a plan view as in the related art, stress is likely to be concentrated particularly on the part of the ceiling portion that corresponds to the corner portion. Therefore, when the application example of the invention is applied in such a case, the effect thereof becomes noticeable.

APPLICATION EXAMPLE 5

In the electronic device according to the application example, it is preferable that the substrate includes a diaphragm portion that is disposed at a position where the diaphragm portion overlaps with the ceiling portion in a plan view and that is deformed in a flexural manner by the reception of pressure, and the functional element is a sensor element that outputs an electrical signal from strain.

With this configuration, it is possible to realize the electronic device (physical quantity sensor) that can detect pressure.

APPLICATION EXAMPLE 6

A physical quantity sensor according to this application example includes a substrate that includes a diaphragm portion which is deformed in a flexural manner by the reception of pressure, a sensor element that is arranged on one face side of the diaphragm portion, a wall portion that is arranged to surround the sensor element on the one face side of the substrate in a plan view of the substrate, and a ceiling portion that is arranged on the opposite side of the wall portion from the substrate and constitutes an inner space with the wall portion, in which the ceiling portion includes a first layer that includes a through hole, and a second layer that is stacked on the first layer on the opposite side of the first layer from the substrate and closes an opening portion of the through hole, the second layer in which at least a part of the outer periphery of a contact portion where the second layer is in contact with the first layer is on the outside of the inner space in a plan view.

According to such a physical quantity sensor, when a protective film (insulating layer) is formed on the first layer on the outside of a contact portion where the first layer is in contact with the second layer, a stepped portion that is formed on the first layer by the protective film can be arranged on the wall portion that has comparatively high rigidity. Therefore, when external forces are exerted on the ceiling portion due to thermal contraction and the like, it is possible to alleviate the concentration of stress on the stepped portion and to reduce damage such as cracks in the ceiling portion. As a consequence, it is possible to reduce the degradation of characteristics due to a decrease in the air tightness of the inner space and to improve reliability.

APPLICATION EXAMPLE 7

A pressure sensor according to this application example includes the electronic device according to the application example.

With this configuration, it is possible to provide the pressure sensor that has excellent reliability.

APPLICATION EXAMPLE 8

A vibrator according to this application example includes the electronic device according to the application example.

With this configuration, it is possible to provide the vibrator that has excellent reliability.

APPLICATION EXAMPLE 9

An altimeter according to this application example includes the electronic device according to the application example.

With this configuration, it is possible to provide the altimeter that has excellent reliability.

APPLICATION EXAMPLE 10

According to this application example, an electronic apparatus according to this application example includes the electronic device according to the application example.

With this configuration, it is possible to provide the electronic apparatus that includes the electronic device having excellent reliability.

APPLICATION EXAMPLE 11

A moving object according to this application example includes the electronic device according to the application example.

With this configuration, it is possible to provide the moving object that includes the electronic device having excellent reliability.

BRIEF DESCRIPTION OF THE DRAWINGS

The invention will be described with reference to the accompanying drawings, wherein like numbers reference like elements.

FIG. 3A is a sectional view illustrating the physical quantity sensor in an increased pressure state, and FIG. 3B is a plan view illustrating the physical quantity sensor in the increased pressure state.

FIGS. 8A and 8B are diagrams for describing a resonator that the vibrator illustrated in FIG. 7 is provided with: FIG. 8A is a sectional view, and FIG. 8B is a plan view.

DESCRIPTION OF EXEMPLARY EMBODIMENTS

Hereinafter, an electronic device, a physical quantity sensor, a pressure sensor, a vibrator, an altimeter, an electronic apparatus, and a moving object according to the invention will be described in detail on the basis of each embodiment illustrated in the appended drawings.

1. Physical Quantity Sensor

First Embodiment

Figure 1:
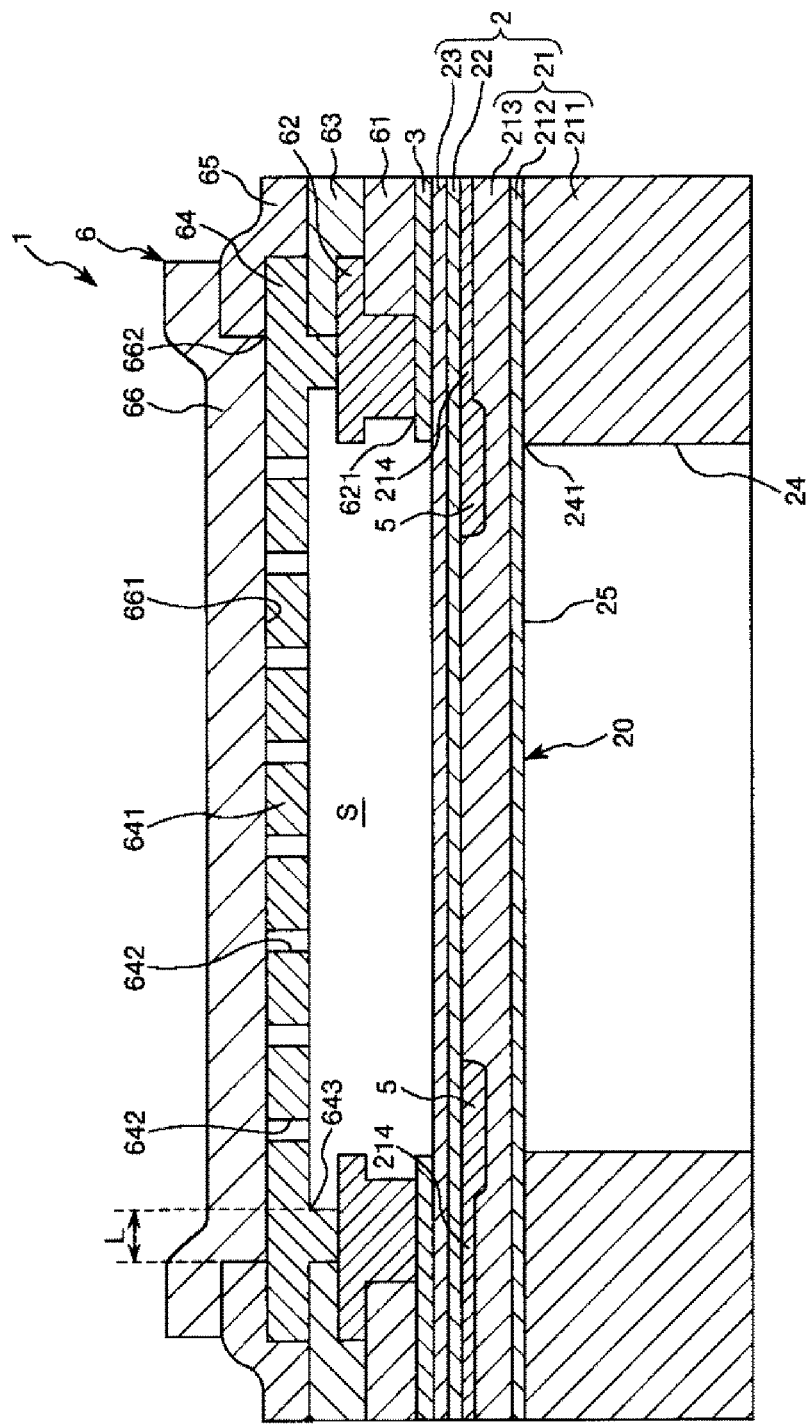
FIG. 1 is a sectional view illustrating an electronic device (physical quantity sensor) that is in accordance with a first embodiment of the invention.
Figure 2:
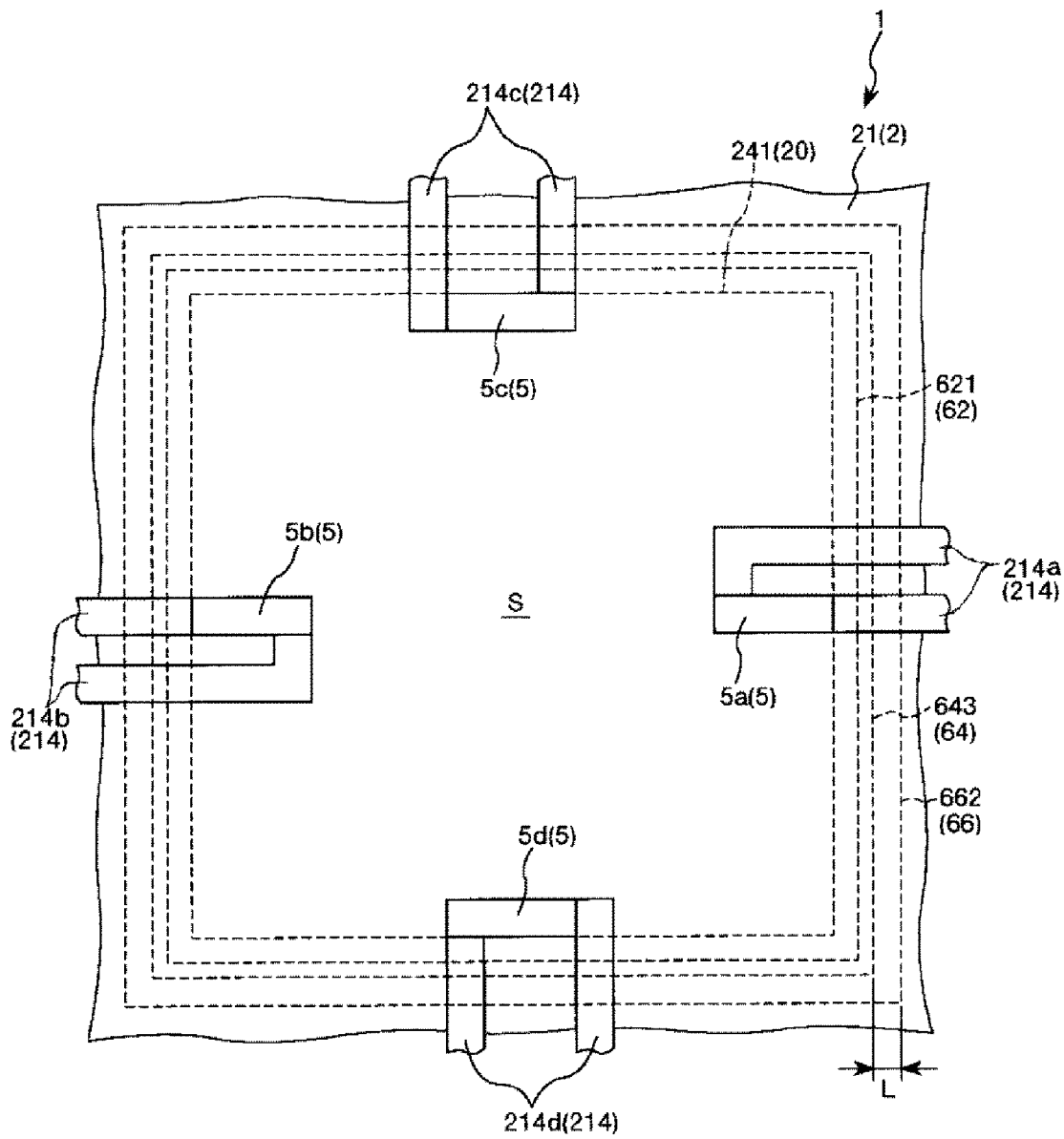
FIG. 2 is a plan view illustrating the arrangement of piezoresistive elements (sensor elements) and a protective film (insulating layer) of the physical quantity sensor illustrated in FIG. 1.
Figure 3A:
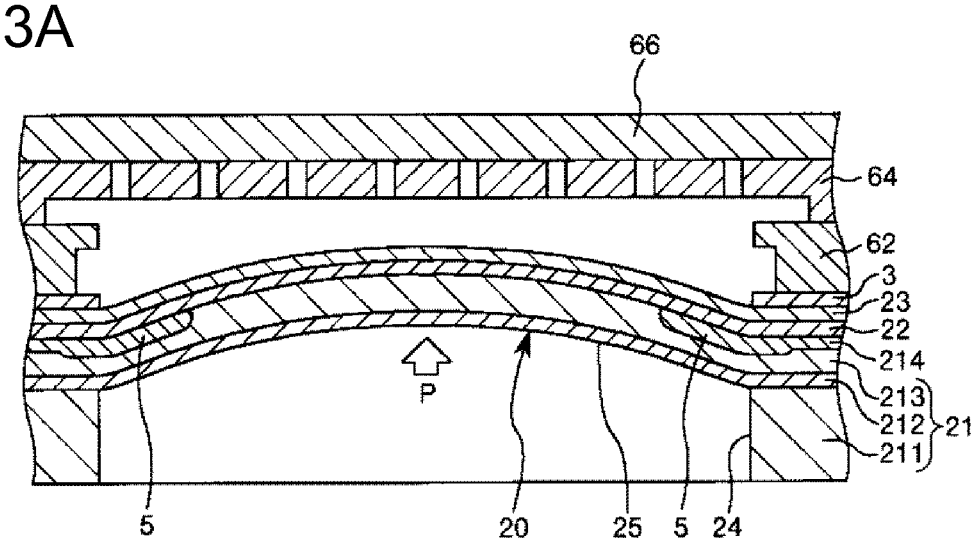
FIGS. 3A and 3B are diagrams for describing the action of the physical quantity sensor illustrated in FIG. 1.
Figure 3B:
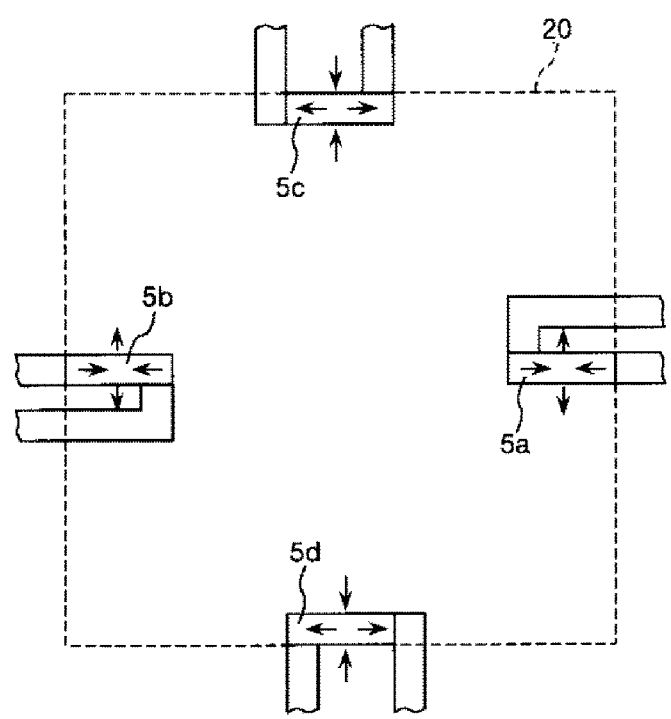

FIG. 1 is a sectional view illustrating a physical quantity sensor that is in accordance with a first embodiment of the invention. FIG. 2 is a plan view illustrating the arrangement of piezoresistive elements (sensor elements) and a protective film (insulating layer) of the physical quantity sensor illustrated in FIG. 1. FIGS. 3A and 3B are diagrams for describing the action of the physical quantity sensor illustrated in FIG. 1 in which FIG. 3A is a sectional view illustrating the physical quantity sensor in an increased pressure state, and FIG. 3B is a plan view illustrating the physical quantity sensor in the increased pressure state. Hereinafter, the upper part of FIG. 1 will be referred to as "up" and the lower part as "down" for convenience of description.

A physical quantity sensor 1 illustrated in FIG. 1 is provided with a substrate 2, a plurality of piezoresistive elements 5 (sensor elements), a laminated structure 6, and an intermediate layer 3. The substrate 2 includes a diaphragm portion 20. The plurality of piezoresistive elements 5 is functional elements arranged in the diaphragm portion 20. The laminated structure 6 forms a cavity portion S (pressure reference chamber) along with the substrate 2. The intermediate layer 3 is arranged between the substrate 2 and the laminated structure 6.

Hereinafter, each portion constituting the physical quantity sensor 1 will be described in order.

Substrate

The substrate 2 includes a semiconductor substrate 21, an insulating film 22, and an insulating film 23. The insulating film 22 is disposed on one face of the semiconductor substrate 21. The insulating film 23 is disposed on the opposite face of the insulating film. 22 from the semiconductor substrate 21.

The semiconductor substrate 21 is an SOI substrate in which a silicon layer 211 (handle layer), a silicon oxide layer 212 (box layer), and a silicon layer 213 (device layer) are laminated in this order. The silicon layer 211 is configured of monocrystalline silicon. The silicon oxide layer 212 is configured of a silicon oxide film. The silicon layer 213 is configured of monocrystalline silicon. The semiconductor substrate 21 is not limited to an SOI substrate and may be one of other semiconductor substrates such as a monocrystalline silicon substrate.

The insulating film 22 is, for example, a silicon oxide film and has insulating properties. The insulating film 23 is, for example, a silicon nitride film, has insulating properties, and has tolerance to etching liquid that includes hydrofluoric acid. By interposing the insulating film 22 (silicon oxide film) between the semiconductor substrate 21 (silicon layer 213) and the insulating film 23 (silicon nitride film), the insulating film 22 can alleviate the propagation of stress generated in the deposition of the insulating film 23 to the semiconductor substrate 21. The insulating film 22 can also be used as an inter-element separating film when the semiconductor substrate 21 and a semiconductor circuit thereabove are formed. Materials constituting the insulating films 22 and 23 are not limited to the above example. In addition, either the insulating film. 22 or the insulating film 23 may not be provided if necessary.

The patterned intermediate layer 3 is arranged on such an insulating film 23 of the substrate 2. The intermediate layer 3 is formed to surround the periphery of the diaphragm portion 20 in a plan view. The intermediate layer 3 forms a stepped portion between the upper face of the intermediate layer 3 and the upper face of the substrate 2 toward the center (inside) of the diaphragm portion 20. The stepped portion has the same thickness as the intermediate layer. Accordingly, it is possible to concentrate stress on apart of the diaphragm portion 20 that is the boundary between the diaphragm portion 20 and the stepped portion when the diaphragm portion 20 is deformed in a flexural manner by the reception of pressure. Thus, detection sensitivity can be improved by arranging the piezoresistive elements 5 at the boundary part (or near the boundary part).

The intermediate layer 3 is configured of, for example, monocrystalline silicon, polycrystalline silicon (polysilicon), or amorphous silicon. The intermediate layer 3 may be configured by, for example, doping (through diffusion or implantation) monocrystalline silicon, polycrystalline silicon (polysilicon), or amorphous silicon with an impurity such as phosphorus or boron. Since the intermediate layer 3 has conductivity in this case, apart of the intermediate layer 3 can be used as the gate electrode of an MOS transistor when, for example, the MOS transistor is formed on the substrate 2 outside the cavity portion S. In addition, a part of the intermediate layer 3 can be used as an interconnect.

The diaphragm portion 20 that is thinner than the part therearound and that is deformed in a flexural manner by the reception of pressure is disposed in such a substrate 2. The diaphragm portion 20 is formed by disposing a bottomed recessed portion 24 on the lower face of the semiconductor substrate 21. That is, the diaphragm portion 20 is configured to include the bottom portion of the recessed portion 24 that is open on one face of the substrate 2. The lower face of the diaphragm portion 20 is configured as a pressure reception face 25. In the present embodiment, the diaphragm portion 20 has a square plan-view shape as illustrated in FIG. 2.

In the substrate 2 of the present embodiment, the recessed portion 24 passes through the silicon layer 211, and the diaphragm portion 20 is configured of four layers of the silicon oxide layer 212, the silicon layer 213, the insulating film 22, and the insulating film 23. As described later, the silicon oxide layer 212 can be used as an etch stop layer when the recessed portion 24 is formed by etching in a process of manufacturing the physical quantity sensor 1. This can reduce variations in the thickness of the diaphragm portion 20 for each product manufactured.

The recessed portion 24 may not pass through the silicon layer 211. The diaphragm portion 20 may be configured of five layers of a thinned portion of the silicon layer 211, the silicon oxide layer 212, the silicon layer 213, the insulating film 22, and the insulating film 23.

Piezoresistive Element (Functional Element)

Each of the plurality of piezoresistive elements 5 is formed on the cavity portion S side of the diaphragm portion 20 as illustrated in FIG. 1. The piezoresistive elements 5 are formed in the silicon layer 213 of the semiconductor substrate 21.

The plurality of piezoresistive elements 5 is configured of a plurality of piezoresistive elements 5a, 5b, 5c, and 5d that is arranged in the peripheral portion of the diaphragm portion 20 as illustrated in FIG. 2.

The piezoresistive element 5a, the piezoresistive element 5b, the piezoresistive element 5c, and the piezoresistive element 5d are respectively arranged in correspondence with the four edges of the diaphragm portion 20 that form a quadrangle in a plan view viewed from the thickness direction of the substrate 2 (hereinafter, simply referred to as "plan view").

The piezoresistive element 5a extends along a direction perpendicular to the corresponding edge of the diaphragm portion 20. A pair of interconnects 214a is electrically connected to both of the end portions of the piezoresistive element 5a. Similarly, the piezoresistive element 5b extends along a direction perpendicular to the corresponding edge of the diaphragm portion 20. A pair of interconnects 214b is electrically connected to both of the end portions of the piezoresistive element 5b.

The piezoresistive element 5c, meanwhile, extends along a direction parallel to the corresponding edge of the diaphragm portion 20. A pair of interconnects 214c is electrically connected to both of the end portions of the piezoresistive element 5c. Similarly, the piezoresistive element 5d extends along a direction parallel to the corresponding edge of the diaphragm portion 20. A pair of interconnects 214d is electrically connected to both of the end portions of the piezoresistive element 5d.

Hereinafter, the interconnects 214a, 214b, 214c, and 214d may be collectively referred to as "interconnect 214".

Such piezoresistive elements 5 and an interconnect 214 are configured of, for example, silicon (monocrystalline silicon) that is doped (through diffusion or implantation) with an impurity such as phosphorus or boron. The concentration of the dopant impurity in the interconnect 214 is higher than the concentration of the dopant impurity in the piezoresistive elements 5. The interconnect 214 may be configured of metal.

The plurality of piezoresistive elements 5, for example, is configured to have the same resistance value in a natural state.

The piezoresistive elements 5 described thus far constitute a bridge circuit (Wheatstone bridge circuit) through the interconnect 214 and the like. A drive circuit (not illustrated) that supplies drive voltage is connected to the bridge circuit. The bridge circuit outputs a signal (voltage) that corresponds to the resistance values of the piezoresistive elements 5.

Laminated Structure

The laminated structure 6 is formed to define the cavity portion S between the laminated structure 6 and the substrate 2. The laminated structure 6 is arranged on the piezoresistive elements 5 side of the diaphragm portion 20 and defines (constitutes) the cavity portion S (inner space) along with the diaphragm portion 20 (or with the substrate 2).

The laminated structure 6 includes an interlayer insulating film 61, an interconnect layer 62, an interlayer insulating film 63, an interconnect layer 64, a surface protective film 65, and a seal layer 66. The interlayer insulating film 61 is formed on the substrate 2 to surround the piezoresistive elements 5 in a plan view. The interconnect layer 62 is formed on the interlayer insulating film 61. The interlayer insulating film 63 is formed on the interconnect layer 62 and the interlayer insulating film 61. The interconnect layer 64 is formed on the interlayer insulating film. 63 and includes a cladding layer 641 that is provided with a plurality of pores 642 (open holes). The surface protective film 65 is formed on the interconnect layer 64 and the interlayer insulating film 63. The seal layer 66 is disposed on the cladding layer 641.

Each of the interlayer insulating films 61 and 63 is configured of, for example, a silicon oxide film. Each of the interconnect layer 62, the interconnect layer 64, and the seal layer 66 is configured of metal such as aluminum. The seal layer 66 seals the pores 642 that the cladding layer 641 includes. The surface protective film 65 is, for example, a silicon nitride film.

In such a laminated structure 6, a structure that is configured of the interconnect layer 62 and the interconnect layer 64 excluding the cladding layer 641 constitutes "wall portion" that is arranged to surround the piezoresistive elements 5 on one face side of the substrate 2 in a plan view. A structure that is configured of the cladding layer 641 and the seal layer 66 constitutes "ceiling portion" that is arranged on the opposite side of the wall portion from the substrate 2 and that constitutes the cavity portion S (inner space) along with the wall portion. The cladding layer 641 constitutes "first layer" that includes the pores 642 which are through holes passing through the cladding layer 641 in the thickness direction thereof, and the seal layer 66 constitutes "second layer" that is stacked on the opposite side of the cladding layer 641 from the substrate 2 and that closes opening portions of the pores 642. An outer periphery 662 of a contact portion 661 where the seal layer 66 is in contact with the cladding layer 641 is on the outside of the cavity portion S in a plan view. The wall portion, the ceiling portion, and matters relevant to these will be described in detail later.

Such a laminated structure 6 can be formed by using a semiconductor manufacturing process such as a CMOS process. A semiconductor circuit may be fabricated on and above the silicon layer 213. The semiconductor circuit includes active elements such as an MOS transistor and besides includes other circuit elements such as a capacitor, an inductor, a resistor, a diode, and an interconnect (including the interconnects connected to the piezoresistive elements 5) that are formed if necessary.

The cavity portion S that is defined by the substrate 2 and the laminated structure 6 is an airtight space. The cavity portion S functions as a pressure reference chamber that provides a reference value of pressure that the physical quantity sensor 1 detects. In the present embodiment, the cavity portion S is in a vacuum state (pressure is less than or equal to 300 Pa). By making a vacuum state in the cavity portion S, the physical quantity sensor 1 can be used as "absolute pressure sensor" that detects pressure with a vacuum state as a reference, and thus the convenience of use of the physical quantity sensor 1 is improved.

The cavity portion S may not be in a vacuum state. The cavity portion S may be under atmospheric pressure, may be in a decreased pressure state where pressure is below atmospheric pressure, or may be in an increased pressure state where pressure is over atmospheric pressure. An inert gas such as a nitrogen gas and a noble gas may be sealed in the cavity portion S.

The configuration of the physical quantity sensor 1 is briefly described thus far.

In the physical quantity sensor 1 having such a configuration, a pressure P that the pressure reception face 25 of the diaphragm portion 20 receives deforms the diaphragm portion 20 as illustrated in FIG. 3A. This causes the piezoresistive elements 5a, 5b, 5c, and 5d to be strained as illustrated in FIG. 3B, and the resistance values of the piezoresistive elements 5a, 5b, 5c, and 5d are changed. Accordingly, the output of the bridge circuit configured of the piezoresistive elements 5a, 5b, 5c, and 5d is changed, and the magnitude of the pressure received on the pressure reception face 25 can be obtained on the basis of the output.

More specifically, the product of the resistance values of the piezoresistive elements 5a and 5b is the same as the product of the resistance values of the piezoresistive elements 5c and 5d in a natural state prior to the above-described deformation of the diaphragm portion 20, such as when the piezoresistive elements 5a, 5b, 5c, and 5d have the same resistance value. Thus, the output (potential difference) of the bridge circuit is zero.

Meanwhile, when the above-described deformation of the diaphragm portion 20 occurs, compressive strains and tensile strains occur respectively along the longitudinal direction and the widthwise direction of the piezoresistive elements 5a and 5b, and tensile strains and compressive strains occur respectively along the longitudinal direction and the widthwise direction of the piezoresistive elements 5c and 5d as illustrated in FIG. 3B. Therefore, when the above-described deformation of the diaphragm portion 20 occurs, either the resistance values of the piezoresistive elements 5a and 5b or the resistance values of the piezoresistive elements 5c and 5d are increased, and the other resistance values are decreased.

Such strain exerted on the piezoresistive elements 5a, 5b, 5c, and 5d causes a difference between the product of the resistance values of the piezoresistive elements 5a and 5b and the product of the resistance values of the piezoresistive elements 5c and 5d, and the output (potential difference) corresponding to the difference is output from the bridge circuit. The magnitude of the pressure (absolute pressure) received on the pressure reception face 25 can be obtained on the basis of the output from the bridge circuit.

The difference between the product of the resistance values of the piezoresistive elements 5a and 5b and the product of the resistance values of the piezoresistive elements 5c and 5d can be significantly changed because either the resistance values of the piezoresistive elements 5a and 5b or the resistance values of the piezoresistive elements 5c and 5d are increased while the other resistance values are decreased when the above-described deformation of the diaphragm portion 20 occurs. Accordingly, the output from the bridge circuit can be increased. As a result, pressure detection sensitivity can be increased.

As such, in the physical quantity sensor 1, the diaphragm portion 20 that the substrate 2 includes is disposed at a position where the diaphragm portion 20 overlaps with the cladding layer 641 in a plan view. The diaphragm portion 20 is deformed in a flexural manner by the reception of pressure. Accordingly, it is possible to realize the physical quantity sensor 1 that can detect pressure. In addition, since the piezoresistive elements 5 arranged in the diaphragm portion 20 are sensor elements that output electrical signals from strain, pressure detection sensitivity can be improved.

Wall Portion and Ceiling Portion

Hereinafter, the wall portion and the ceiling portion will be described in detail.

Figure 4:
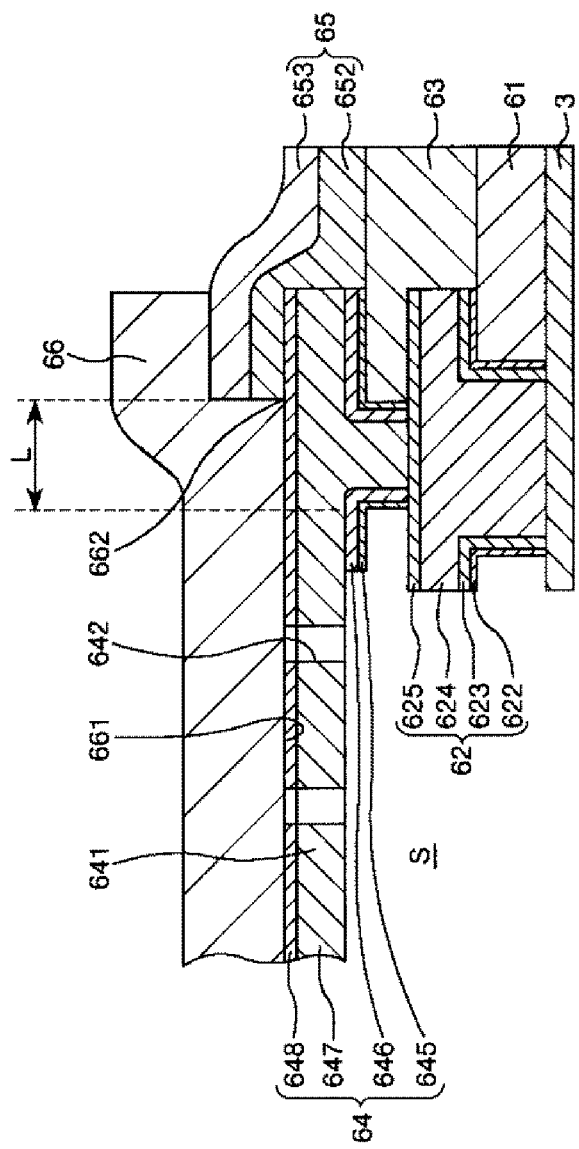
FIG. 4 is a partial enlarged sectional view of the physical quantity sensor illustrated in FIG. 1.

FIG. 4 is a partial enlarged sectional view of the physical quantity sensor illustrated in FIG. 1.

As described above, the cladding layer 641 (first layer) and the seal layer 66 (second layer) constitute "ceiling portion", and the outer periphery 662 of the contact portion 661 where the seal layer 66 is in contact with the cladding layer 641 is on the outside of the cavity portion S in a plan view (refer to FIGS. 1, 2, and 4). Accordingly, it is possible to arrange a stepped portion that is formed on the cladding layer 641 by the surface protective film 65 (insulating layer) which is formed on the outside of the contact portion 661 on the cladding layer 641 (that is, a stepped portion that is formed of the upper face of the cladding layer 641, the inner side face of the surface protective film. 65, and the upper face of the surface protective film 65 (hereinafter, may be simply referred to as "stepped portion")) on the wall portion that has comparatively high rigidity (specifically, the part of the interconnect layer 64 that is supported by the interconnect layer 62 or the interlayer insulating film 63 from below). Therefore, when external forces are exerted on the ceiling portion due to thermal contraction and the like, it is possible to alleviate the concentration of stress on the stepped portion and to reduce damage such as cracks in the ceiling portion. As a consequence, it is possible to reduce the degradation of characteristics due to a decrease in the air tightness of the cavity portion S and to improve reliability.

In the present embodiment, in a plan view, the outer periphery 662 of the contact portion 661 where the seal layer 66 is in contact with the cladding layer 641 is on the outside of an inner periphery 621 of the end portion of the wall portion that is on the substrate 2 side of the wall portion, and the outer periphery 662 is on the outside of an inner periphery 643 of the end portion of the wall portion that is on the opposite side of the wall portion from the substrate 2. Accordingly, it is possible to arrange the stepped portion on the highly rigid part of the wall portion and to exhibit the above effect efficiently. The above effect can be exhibited when the outer periphery 662 of the contact portion 661 where the seal layer 66 is in contact with the cladding layer 641 is on the outside of at least the inner periphery 643 of the end portion of the wall portion that is on the opposite side of the wall portion from the substrate 2 in a plan view. While the present embodiment is described in an example in which the outer periphery 662 is on the outside of the inner periphery 643 in a plan view, at least a part of the outer periphery 662 may be positioned on the inner periphery 643 or on the inside of the inner periphery 643 in a plan view.

The surface protective film 65 has a part that is arranged between the outer peripheral portion of the cladding layer 641 and the outer peripheral portion of the seal layer 66. Accordingly, the surface protective film 65 can be used as a protective film when, for example, etching is performed through the pores 642 of the cladding layer 641 during manufacturing of the physical quantity sensor 1. The above stepped portion is formed on the cladding layer 641 by such a surface protective film 65. The seal layer 66 is formed across the stepped portion. If the stepped portion is on the inside of the cavity portion S in a plan view as in the related art when the seal layer 66 is formed, stress is likely to be concentrated particularly on the part of the seal layer 66 that is formed across the stepped portion. Therefore, by positioning the outer periphery 662 or the stepped portion on the outside of the cavity portion S in a plan view when the seal layer 66 is formed across the stepped portion, the above effect becomes noticeable.

The inner periphery 643 of the end portion of the structure (wall portion), which is configured of the interconnect layer 62 and the interconnect layer 64 excluding the cladding layer 641 (ceiling portion), on the opposite side (ceiling portion side) of the structure from the substrate 2 forms a quadrangle in a plan view and includes four corner portions. As such, when the inner periphery 643 of the ceiling portion-side end portion of the wall portion includes corner portions, if the outer periphery of the stepped portion is on the inside of the cavity portion S in a plan view as in the related art, stress is likely to be concentrated particularly on the part of the ceiling portion that corresponds to the corner portions. Therefore, in such a case, by positioning at least the part of the outer periphery 662 of the contact portion 661 that corresponds to the corner portions on the outside of the cavity portion S in a plan view, the above effect becomes noticeable.

In the present embodiment, the whole outer periphery 662 is positioned on the outside of the cavity portion S in a plan view. Accordingly, it is possible to noticeably exhibit the above effect while simplifying design.

A distance L between the outer periphery 662 and the inner periphery 643 in a plan view, although not particularly limited, is preferably greater than the thickness of the seal layer 66. Accordingly, a part of the seal layer 66 that receives the influence of the shape of the stepped portion can be arranged on the wall portion, and the above effect can be increased. Since the size of the physical quantity sensor 1 increases when the distance L is excessively long, the distance L is preferably less than or equal to 10 times the thickness of the seal layer 66.

In the present embodiment, as illustrated in FIG. 4, the interconnect layer 62 is configured to include a Ti layer 622 configured of titanium (Ti), a TiN layer 623 configured of titanium nitride (TiN), an Al layer 624 configured of aluminum (Al), and a TiN layer 625 configured of titanium nitride (TiN), in which these layers are laminated in this order. Similarly, the interconnect layer 64 is configured to include a Ti layer 645 configured of titanium (Ti), a TiN layer 646 configured of titanium nitride (TiN), an Al layer 647 configured of aluminum (Al), and a TiN layer 648 configured of titanium nitride (TiN), in which these layers are laminated in this order.

As such, each of the interconnect layers 62 and 64 is configured of a combination of a plurality of different materials. The ceiling portion that is configured of the cladding layer 641 and the seal layer 66 is configured by using Al, Ti, and TiN and includes a first material (for example, Al) and a second material (for example, TiN). The first material is included in the wall portion, and the second material has a smaller thermal expansion rate than the first material. Accordingly, it is possible to reduce bending of the ceiling portion due to thermal expansion while providing excellent air tightness in the ceiling portion. For example, it is possible to reduce bending of the ceiling portion due to thermal expansion by reducing the thermal expansion of Al that has a great thermal expansion rate with a TiN layer that has a smaller thermal expansion rate while providing excellent air tightness with an Al layer that can be easily made thick.

The surface protective film 65 is configured to include a silicon oxide film 652 and a silicon nitride film 653, in which these films are laminated in this order.

Method for Manufacturing Physical Quantity Sensor

Next, a method for manufacturing the physical quantity sensor 1 will be briefly described.

FIGS. 5A to 6C are diagrams illustrating a process of manufacturing the physical quantity sensor illustrated in FIG. 1. Hereinafter, the method for manufacturing the physical quantity sensor 1 will be described on the basis of these drawings.

Element Forming Process

Figure 5A:
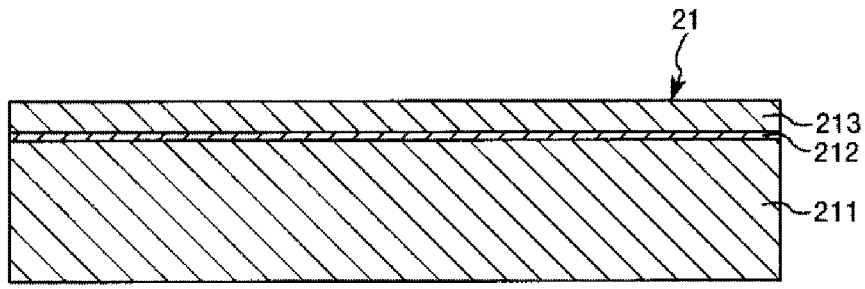
FIGS. 5A to 5D are diagrams illustrating a process of manufacturing the physical quantity sensor illustrated in FIG. 1.

First, the semiconductor substrate 21 that is an SOI substrate is prepared as illustrated in FIG. 5A.

Figure 5B:
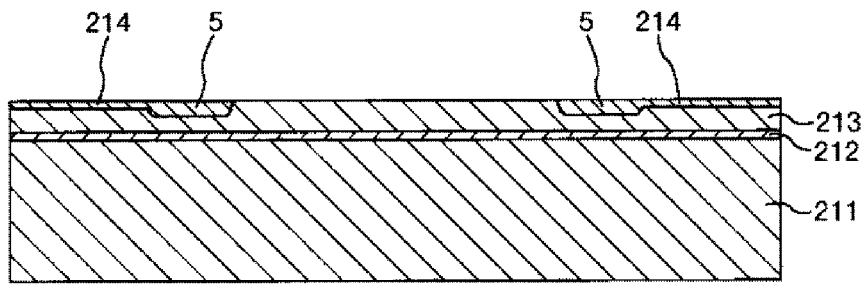

The plurality of piezoresistive elements 5 and the interconnect 214 are formed as illustrated in FIG. 5B by doping (through ion implantation) the silicon layer 213 of the semiconductor substrate 21 with an impurity such as phosphorus (n-type) or boron (p-type).

The concentration of ions implanted into the piezoresistive elements 5 is approximately $1 \times 10^{14}$ atoms/cm² in the case of, for example, implanting boron ions at an energy of +80 keV. The concentration of ions implanted into the interconnect 214 is set to be greater than that of the piezoresistive elements 5. The concentration of ions implanted into the interconnect 214 is approximately $5 \times 10^{15}$ atoms/cm² in the case of, for example, implanting boron ions at an energy of 10 keV. After ions are implanted as described above, for example, annealing is performed at approximately 1000° C. for approximately 20 minutes.

Insulating Film and the Like Forming Process

Figure 5C:
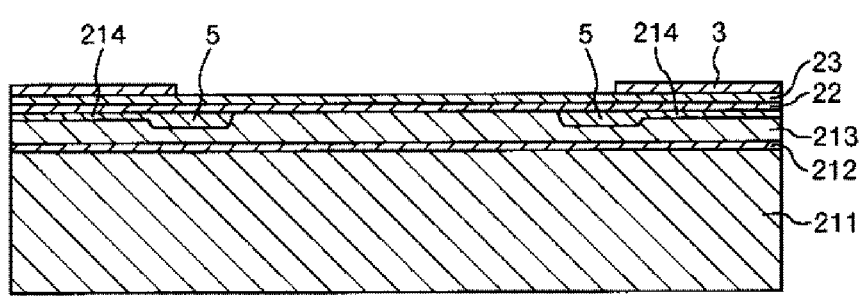

Next, the insulating film 22, the insulating film 23, and the intermediate layer 3 are formed in this order on the silicon layer 213 as illustrated in FIG. 5C.

Each of the insulating films 22 and 23 can be formed by, for example, sputtering or CVD. The intermediate layer 3 can be formed by, for example, depositing polycrystalline silicon through sputtering, CVD, or the like, doping (through ion implantation) the film with an impurity such as phosphorus or boron if necessary, and patterning the film through etching.

Interlayer Insulating Film and Interconnect Layer Forming Process

Figure 5D:
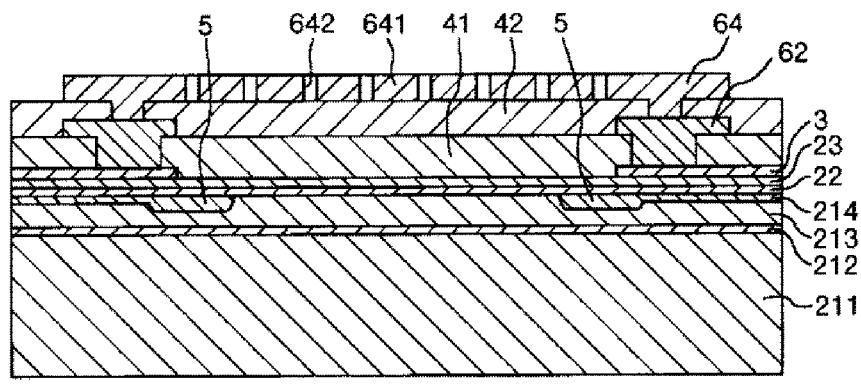

Next, a sacrificial layer 41, the interconnect layer 62, a sacrificial layer 42, and the interconnect layer 64 are formed in this order on the insulating film 23 as illustrated in FIG. 5D.

Each of parts of the sacrificial layers 41 and 42 is removed by a cavity portion forming process described later, and the remaining parts thereof are configured as the interlayer insulating films 61 and 63. Each of the sacrificial layers 41 and 42 is formed by forming a silicon oxide film through sputtering, CVD, or the like and by patterning the silicon oxide film through etching.

Each of the thicknesses of the sacrificial layers 41 and 42, although not particularly limited, is for example, approximately greater than or equal to 1500 nm and less than or equal to 5000 nm.

Each of the interconnect layers 62 and 64 is formed by, for example, forming an aluminum layer through sputtering, CVD, or the like and by patterning the aluminum layer. Although illustration is not provided, when the interconnect layer 62 that includes the Ti layer 622, the TiN layer 623, the Al layer 624, and the TiN layer 625 is formed, the Ti layer 622 and the TiN layer 623 are formed by uniformly forming a Ti layer and a TiN layer in this order and by patterning these layers, and afterward, the Al layer 624 and the TiN layer 625 are formed by uniformly forming an Al layer and a TiN layer in this order and by patterning these layers. The TiN layer 623 has a function of increasing the wettability of Al so as to make the ability of Al to fill the through holes of the sacrificial layer 41 favorable, and the Ti layer 622 has a function of increasing adhesion between the TiN layer 623 and the sacrificial layer 41. The TiN layer that is uniformly formed on the Al layer functions as an anti-reflective film that prevents the reflection of light used in an exposure process of photolithography when the Al layer 624 and the TiN layer 625 are formed by patterning. The interconnect layer 64 can be formed in the same manner.

Each of the thicknesses of the interconnect layers 62 and 64, although not particularly limited, is for example, approximately greater than or equal to 300 nm and less than or equal to 900 nm.

A laminated structure configured of the sacrificial layers 41 and 42 and the interconnect layers 62 and 64 is formed by using a typical CMOS process, and the number of layers laminated is appropriately set according to the necessity thereof. That is, more sacrificial layers and interconnect layers may be laminated if necessary.

Cavity Portion Forming Process

Figure 6A:
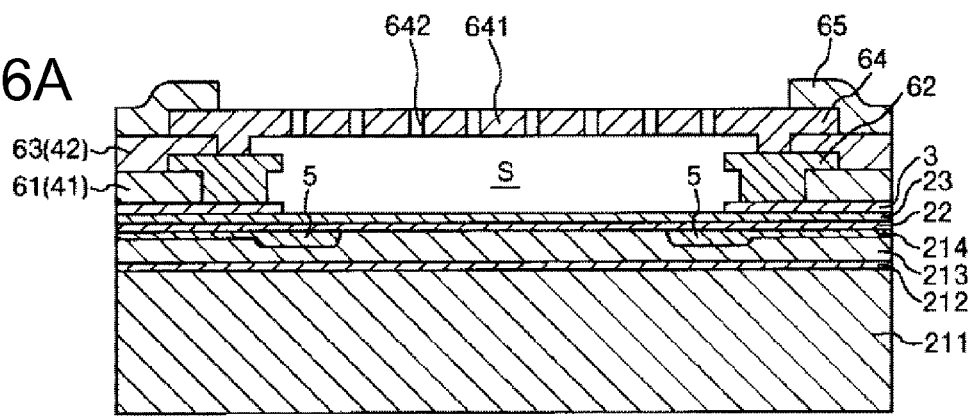
FIGS. 6A to 6C are diagrams illustrating the process of manufacturing the physical quantity sensor illustrated in FIG. 1.

Next, the cavity portion S (cavity) is formed between the insulating film 23 and the cladding layer 641 as illustrated in FIG. 6A by removing parts of the sacrificial layers 41 and 42. Accordingly, the interlayer insulating films 61 and 63 are formed.

The cavity portion S is formed by removing parts of the sacrificial layers 41 and 42 by etching that is performed through the plurality of pores 642 formed in the cladding layer 641. When wet etching is used as the etching, etching liquid such as hydrofluoric acid or buffered hydrofluoric acid is supplied from the plurality of pores 642. When dry etching is used, etching gas such as hydrofluoric acid gas is supplied from the plurality of pores 642. The insulating film 23 functions as an etch stop layer when such etching is performed. In addition, since the insulating film 23 has tolerance to etching liquid, the insulating film 23 has a function of protecting components on the lower side of the insulating film 23 (for example, the insulating film 22, the piezoresistive elements 5, and the interconnect 214) from etching liquid.

The surface protective film 65 is formed by sputtering, CVD, or the like before the etching. Accordingly, the parts of the sacrificial layers 41 and 42 configured as the interlayer insulating films 61 and 63 can be protected when the etching is performed. Examples of a material constituting the surface protective film 65 include materials that have tolerance such as a silicon oxide film, a silicon nitride film, a polyimide film, and an epoxy resin film so as to protect elements from moisture, dust, scratches, and the like. Particularly, a silicon nitride film is preferred. Although illustration is not provided, when the surface protective film 65 that includes the silicon oxide film 652 and the silicon nitride film 653 is formed, the silicon oxide film 652 and the silicon nitride film 653 are formed by uniformly forming a silicon oxide film and a silicon nitride film in this order and by patterning these films. The thickness of the surface protective film 65, although not particularly limited, is for example, approximately greater than or equal to 500 nm and less than or equal to 2000 nm.

Sealing Process

Figure 6B:
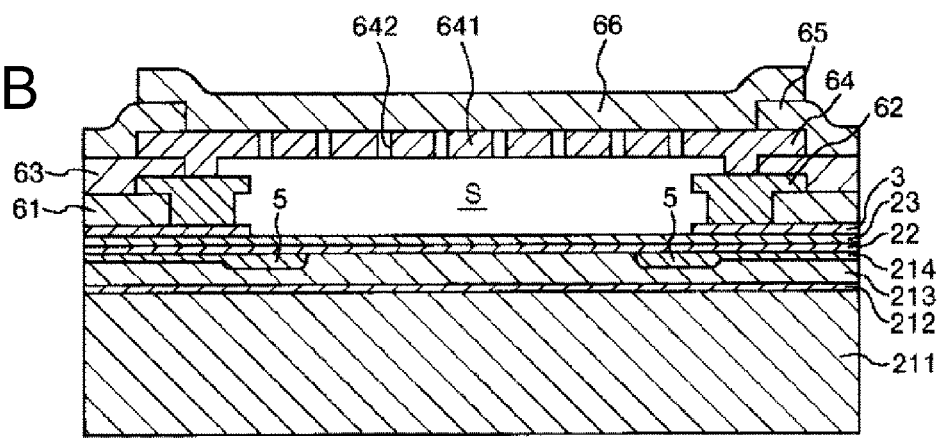

Next, the seal layer 66 that is configured of, for example, a silicon oxide film, a silicon nitride film, or a film made of metal such as Al, Cu, W, Ti, or TiN is formed on the cladding layer 641 by sputtering, CVD, or the like to seal each of the pores 642 as illustrated in FIG. 6B. Accordingly, the cavity portion S is sealed by the seal layer 66, and the laminated structure 6 is obtained.

The thickness of the seal layer 66, although not particularly limited, is for example, approximately greater than or equal to 1000 nm and less than or equal to 5000 nm.

Diaphragm Forming Process

Figure 6C:
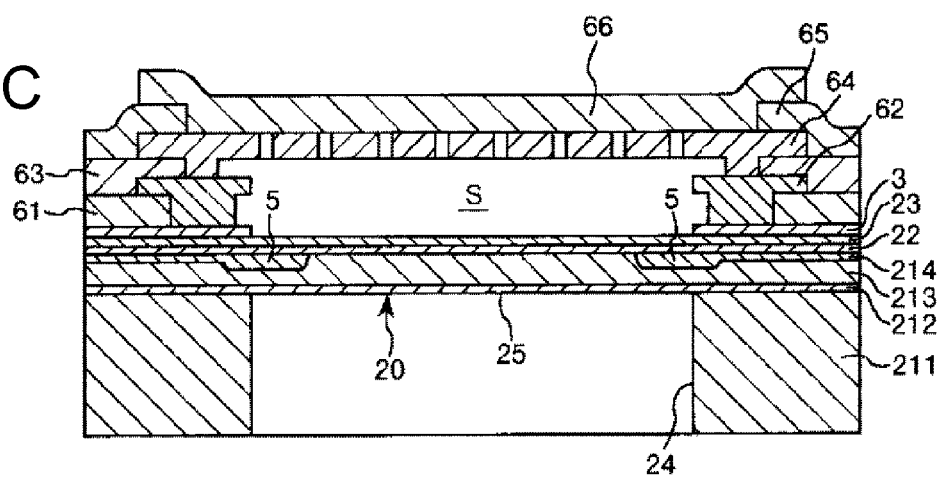

Next, the recessed portion 24 is formed by grinding the lower face of the silicon layer 211 if necessary and by removing (working) apart of the lower face of the silicon layer 211 through etching as illustrated in FIG. 6C. Accordingly, the diaphragm portion 20 that faces the cladding layer 641 through the cavity portion S is formed.

The silicon oxide layer 212 functions as an etch stop layer when a part of the lower face of the silicon layer 211 is removed. Accordingly, the thickness of the diaphragm portion 20 can be accurately defined.

Either dry etching or wet etching or the like may be used as a method for removing a part of the lower face of the silicon layer 211.

According to the processes described thus far, it is possible to manufacture the physical quantity sensor 1.

Second Embodiment

Next, a second embodiment of the invention will be described.

Figure 7:
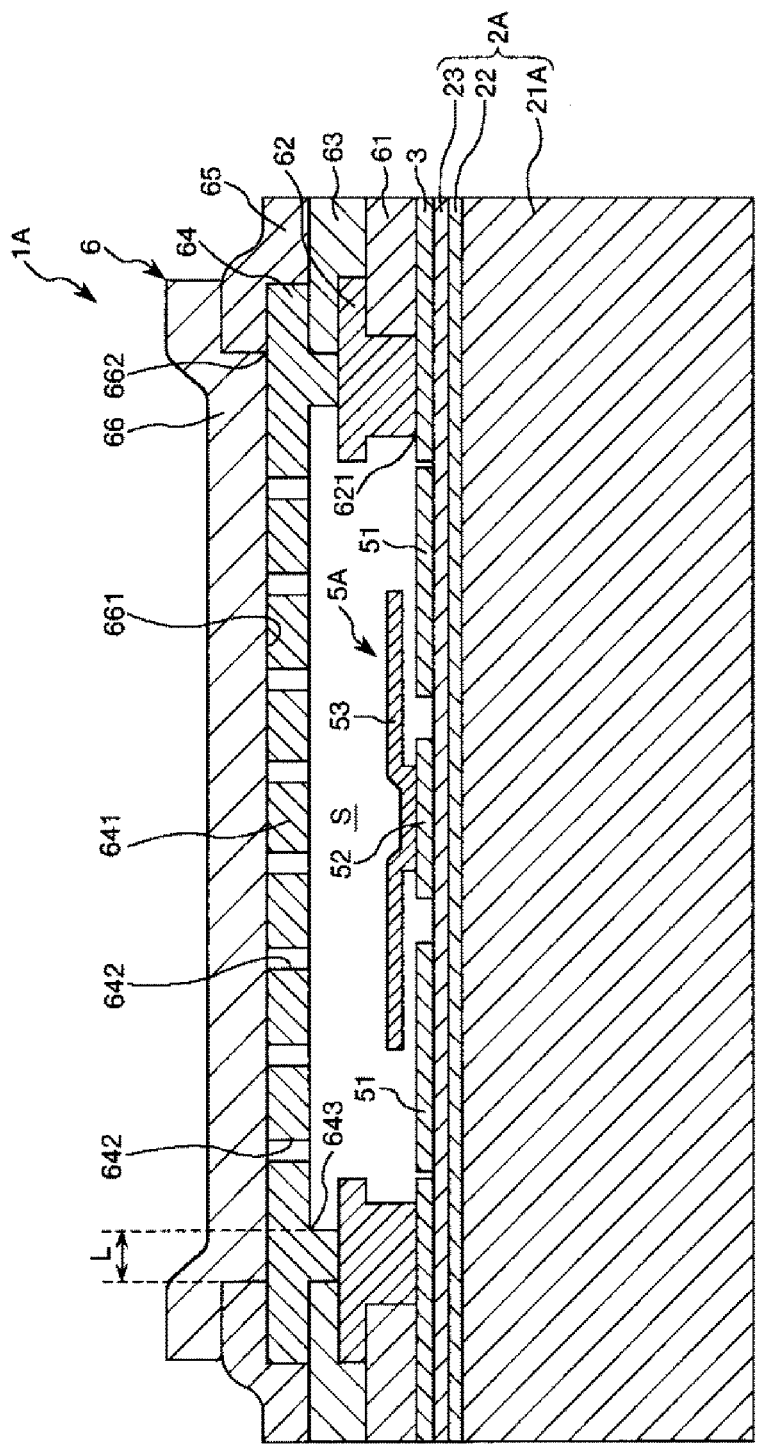
FIG. 7 is a sectional view illustrating an electronic device (vibrator) that is in accordance with a second embodiment of the invention.
Figure 8A:
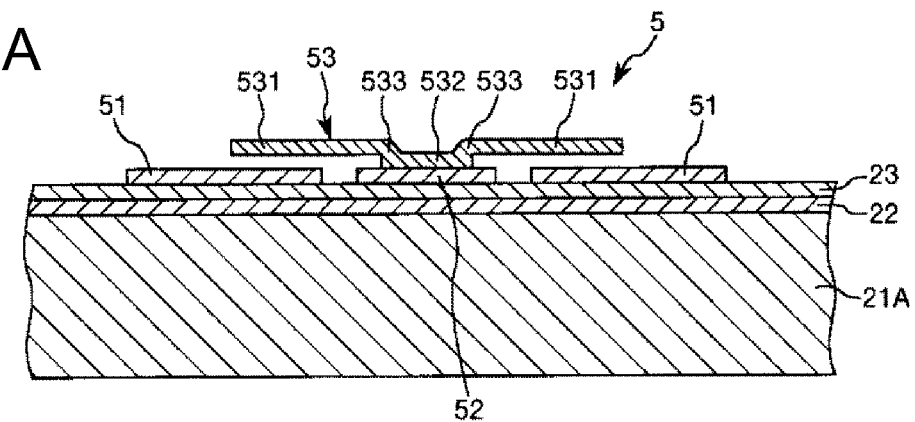
Figure 8B:
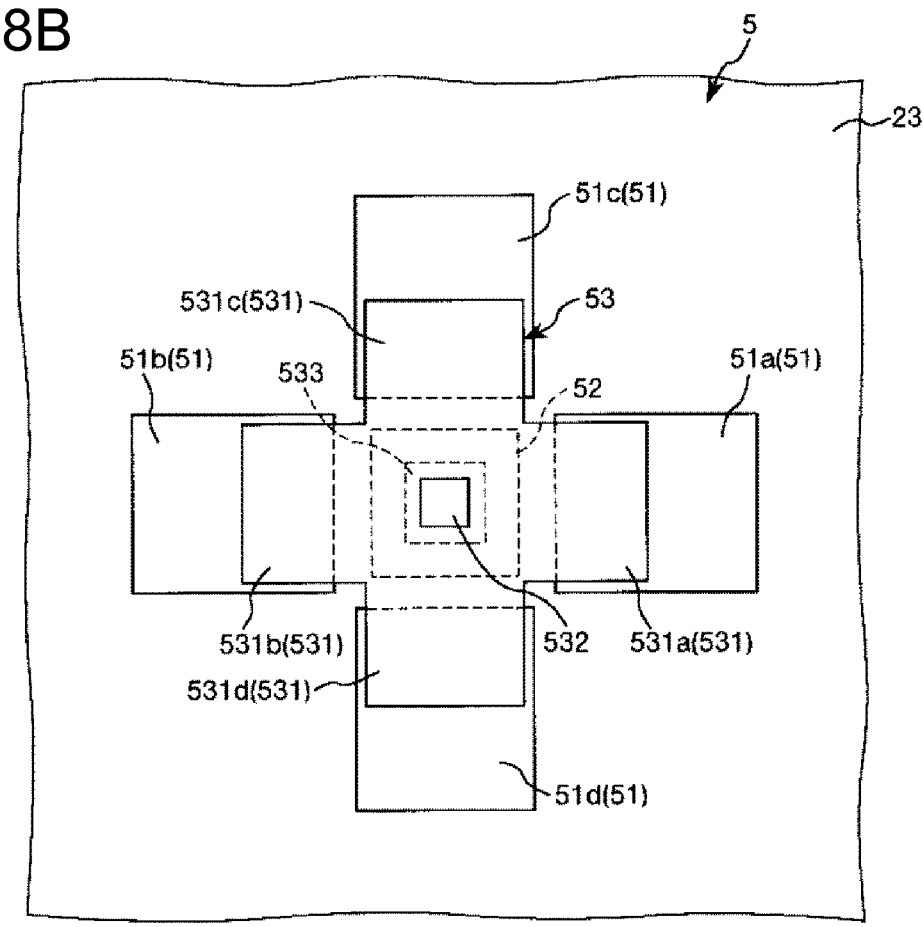

FIG. 7 is a sectional view illustrating an electronic device (vibrator) that is in accordance with the second embodiment of the invention. FIGS. 8A and 8B are diagrams for describing a resonator that the vibrator illustrated in FIG. 7 is provided with: FIG. 8A is a sectional view, and FIG. 8B is a plan view.

Hereinafter, while the second embodiment of the invention will be described, differences between the second embodiment and the above embodiment will be mainly described, and the same matter will not be described.

The present embodiment is the same as the first embodiment except that the electronic device according to the invention is applied to a vibrator.

An electronic device 1A illustrated in FIG. 7 is configured in the same manner as the physical quantity sensor 1 of the first embodiment except that the electronic device 1A is provided with a substrate 2A and a resonator 5A (functional element) instead of the substrate 2 and the piezoresistive elements 5. That is, the electronic device 1A is provided with the substrate 2A, the resonator 5A, the laminated structure 6, and the intermediate layer 3: The resonator 5A that is a functional element is arranged on the substrate 2A, the laminated structure 6 forms the cavity portion S (inner space) along with the substrate 2A, and the intermediate layer 3 is arranged between the substrate 2A and the laminated structure 6.

The substrate 2A includes a semiconductor substrate 21A, the insulating film 22, and the insulating film 23. The insulating film 22 is disposed on one face of the semiconductor substrate 21A. The insulating film 23 is disposed on the opposite face of the insulating film. 22 from the semiconductor substrate 21A.

The semiconductor substrate 21A is flat and is, for example, a monocrystalline silicon substrate. An SOI substrate may also be used as the semiconductor substrate 21A.

The resonator 5A includes four lower electrodes 51, a lower electrode 52, and an upper electrode 53 that is supported by the lower electrode 52.

The four lower electrodes 51 (fixed electrodes) are configured of two lower electrodes 51a and 51b and two lower electrodes 51c and 51d. The two lower electrodes 51a and 51b are lined up with the lower electrode 52 interposed therebetween along a first direction (left-right direction in FIG. 8B) in a plan view, and the two lower electrodes 51c and 51d are lined up with the lower electrode 52 interposed therebetween along a second direction (up-down direction in FIG. 8B) that is orthogonal with respect to the first direction in a plan view. Each of the four lower electrodes 51 is arranged separately from the lower electrode 52 in a plan view.

The two lower electrodes 51a and 51b are electrically connected to each other through an unillustrated interconnect and are configured to have the same potential. Similarly, the two lower electrodes 51c and 51d are electrically connected to each other through an unillustrated interconnect and are configured to have the same potential.

The upper electrode 53 (vibrating body) includes four movable portions 531 (movable electrodes), a fixed portion 532, and a connecting portion 533. The fixed portion 532 is fixed to the lower electrode 52. The connecting portion 53 connects each movable portion 531 and the fixed portion 532.

The four movable portions 531 are disposed in correspondence with the four lower electrodes 51. Each movable portion 531 faces the corresponding lower electrode 51 at an interval. That is, the four movable portions 531 is configured of two movable portions 531a and 531b and two movable portions 531c and 531d. The two movable portions 531a and 531b are lined up with the fixed portion 532 interposed therebetween along the first direction (left-right direction in FIG. 8B), and the two movable portions 531c and 531d are lined up with the fixed portion 532 interposed therebetween along the second direction (up-down direction in FIG. 8B) that is orthogonal with respect to the first direction.

Such lower electrodes 51 and 52 and an upper electrode 53 are configured by doping (through diffusion or implantation) monocrystalline silicon, polycrystalline silicon (polysilicon), or amorphous silicon with an impurity such as phosphorus or boron and have conductivity. The lower electrodes 51 and 52 can be formed together with the intermediate layer 3 at the same time.

In the electronic device 1A having such a configuration, a first voltage (alternating voltage) that periodically changes is applied between the lower electrodes 51a and 51b and the upper electrode 53, and a second voltage that is the same as the first voltage except that the phase thereof is shifted by 180° is applied between the lower electrodes 51c and 51d and the upper electrode 53.

The movable portions 531a and 531b vibrate in a flexural manner changing the positions thereof alternately in a direction approaching the lower electrodes 51a and 51b and in a direction receding therefrom, and the movable portions 531c and 531d vibrate in a flexural manner in phase opposite to those of the movable portions 531a and 531b changing the positions thereof alternately in a direction approaching the lower electrodes 51c and 51d and in a direction receding therefrom. That is, when the movable portions 531a and 531b changes the positions thereof in a direction approaching the lower electrodes 51a and 51b, the movable portions 531c and 531d change the positions thereof in a direction receding from the lower electrodes 51c and 51d. Meanwhile, when the movable portions 531a and 531b change the positions thereof in a direction receding from the lower electrodes 51a and 51b, the movable portions 531c and 531d change the positions thereof in a direction approaching the lower electrodes 51c and 51d.

By vibrating the movable portions 531a and 531b and the movable portions 531c and 531d in opposite phases, vibrations transferred from the movable portions 531a and 531b to the fixed portion 532 and vibrations transferred from the movable portions 531c and 531d to the fixed portion 532 can cancel each other out. As a consequence, it is possible to reduce the vibrations leaking out through the fixed portion 532, that is, to reduce a so-called vibration leakage and to increase the efficiency of the vibration of the electronic device 1A. As such, the electronic device 1A, since the number of movable portions 531 is plural, can reduce a vibration leakage from the movable portions 531 to outside.

Such an electronic device 1A in combination with, for example, an oscillator circuit (drive circuit) can be used as an oscillator that obtains signals having a predetermined frequency. The oscillator circuit can be disposed as a semiconductor circuit on the substrate 2A.

2. Pressure Sensor

Figure 9:
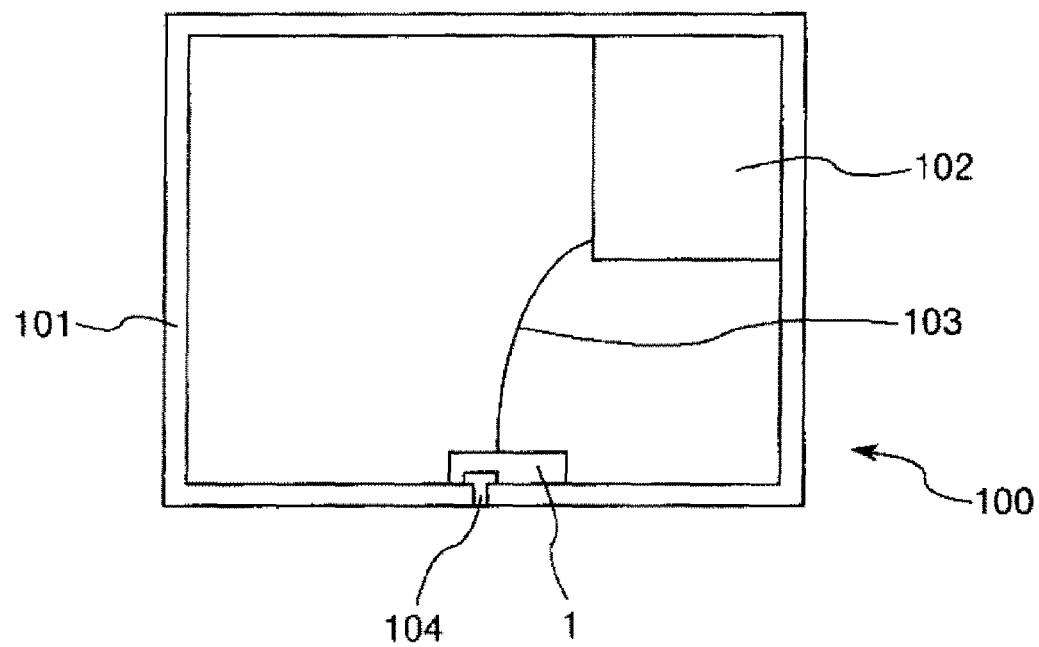
FIG. 9 is a sectional view illustrating an example of a pressure sensor according to the invention.

Next, a pressure sensor that is provided with the physical quantity sensor according to the invention (pressure sensor according to the invention) will be described. FIG. 9 is a sectional view illustrating an example of the pressure sensor according to the invention.

A pressure sensor 100 according to the invention, as illustrated in FIG. 9, is provided with the physical quantity sensor 1, a casing 101, and an operation unit 102. The casing 101 accommodates the physical quantity sensor 1. The operation unit 102 performs an operation of obtaining pressure data from a signal that is obtained from the physical quantity sensor 1. The physical quantity sensor 1 is electrically connected to the operation unit 102 through an interconnect 103.

The physical quantity sensor 1 is fixed inside the casing 101 by an unillustrated fixing unit. The casing 101 includes a through hole 104 so that the diaphragm portion 20 of the physical quantity sensor 1, for example, can communicate with the atmosphere (outside of the casing 101).

According to such a pressure sensor 100, the diaphragm portion 20 receives pressure through the through hole 104. A signal corresponding to the received pressure is transmitted to the operation unit through the interconnect 103 so as to perform the operation of obtaining pressure data. The pressure data obtained from the operation can be displayed via an unillustrated display unit (for example, a monitor of a personal computer).

3. Altimeter

Figure 10:
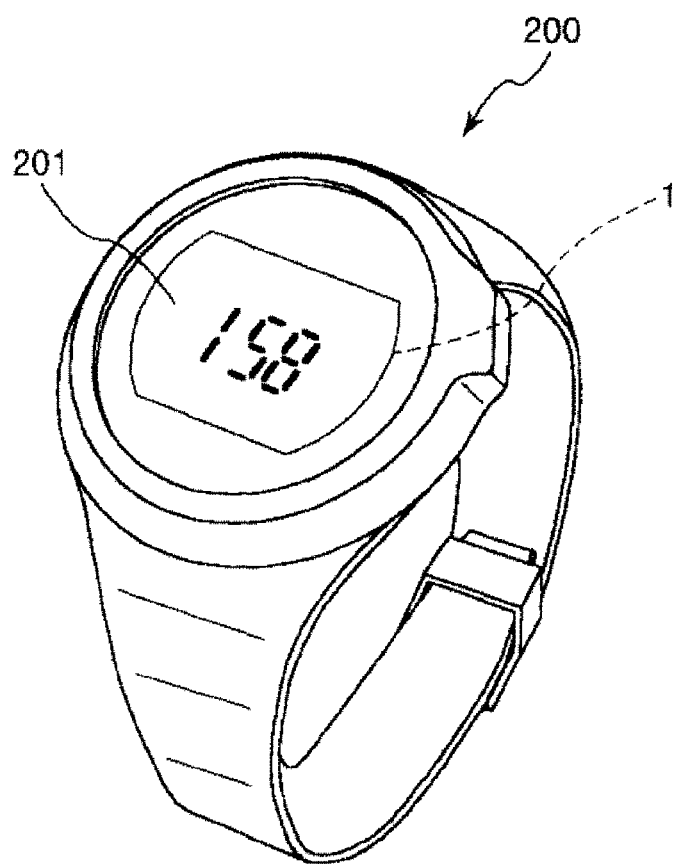
FIG. 10 is a perspective view illustrating an example of an altimeter according to the invention.

Next, an example of an altimeter that is provided with the physical quantity sensor according to the invention (altimeter according to the invention) will be described. FIG. 10 is a perspective view illustrating an example of the altimeter according to the invention.

An altimeter 200 can be worn on a wrist as a wristwatch. The physical quantity sensor 1 (pressure sensor 100) is mounted in the altimeter 200. A display unit 201 can display the altitude of the current location above sea level, the atmospheric pressure of the current location, or the like.

The display unit 201 can display various information such as the current time, the heart rate of a user, and weather.

4. Electronic Apparatus

Figure 11:
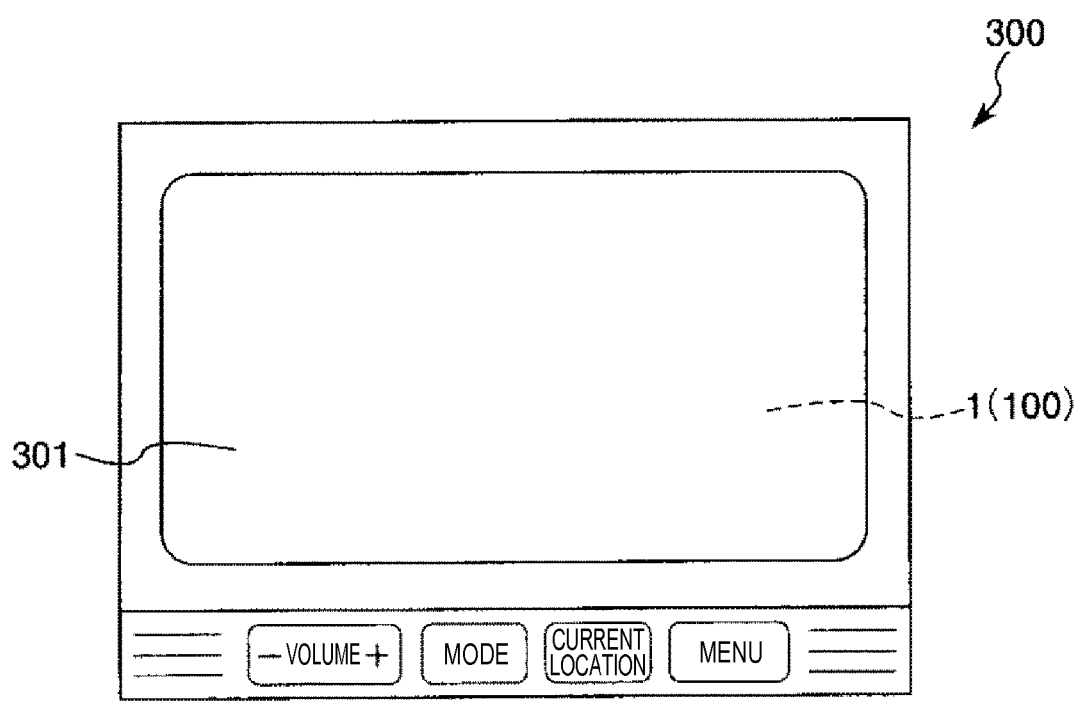
FIG. 11 is a plan view illustrating an example of an electronic apparatus according to the invention.

Next, a navigation system to which an electronic apparatus provided with the physical quantity sensor according to the invention is applied will be described. FIG. 11 is a front view illustrating an example of the electronic apparatus according to the invention.

A navigation system 300 is provided with unillustrated map information, a positional information obtaining unit, a self-contained navigation unit, the physical quantity sensor 1, and a display unit 301. The positional information obtaining unit obtains positional information from a global positioning system (GPS). The self-contained navigation unit is configured of a gyro sensor, an acceleration sensor, and vehicle speed data. The display unit 301 displays predetermined positional information or course information.

According to the navigation system, altitude information can be obtained in addition to the obtained positional information. A navigation system that does not have altitude information cannot determine whether a vehicle traverses a typical road or an elevated road when, for example, the vehicle traverses an elevated road that is represented at substantially the same position as a typical road in the positional information. Thus, such a navigation system provides information of the typical road as prioritized information to the user. The navigation system 300 according to the present embodiment can obtain the altitude information with the physical quantity sensor 1 and thus can provide the user with navigation information about the state of the vehicle traversing an elevated road by detecting an altitude change that is caused by the vehicle entering an elevated road from a typical road.

The display unit 301 has a configuration that can be reduced and thinned in size, such as a liquid crystal panel display and an organic electroluminescence (EL) display.

The electronic apparatus that is provided with the physical quantity sensor according to the invention is not limited to the above example and can be applied to, for example, a personal computer, a cellular phone, a medical apparatus (for example, an electronic thermometer, a sphygmomanometer, a blood glucose meter, an electrocardiograph, an ultrasonic diagnostic apparatus, and an electronic endoscope), various measuring apparatuses, meters (for example, meters in a vehicle, an airplane, and a ship), and a flight simulator.

5. Moving Object

Figure 12:
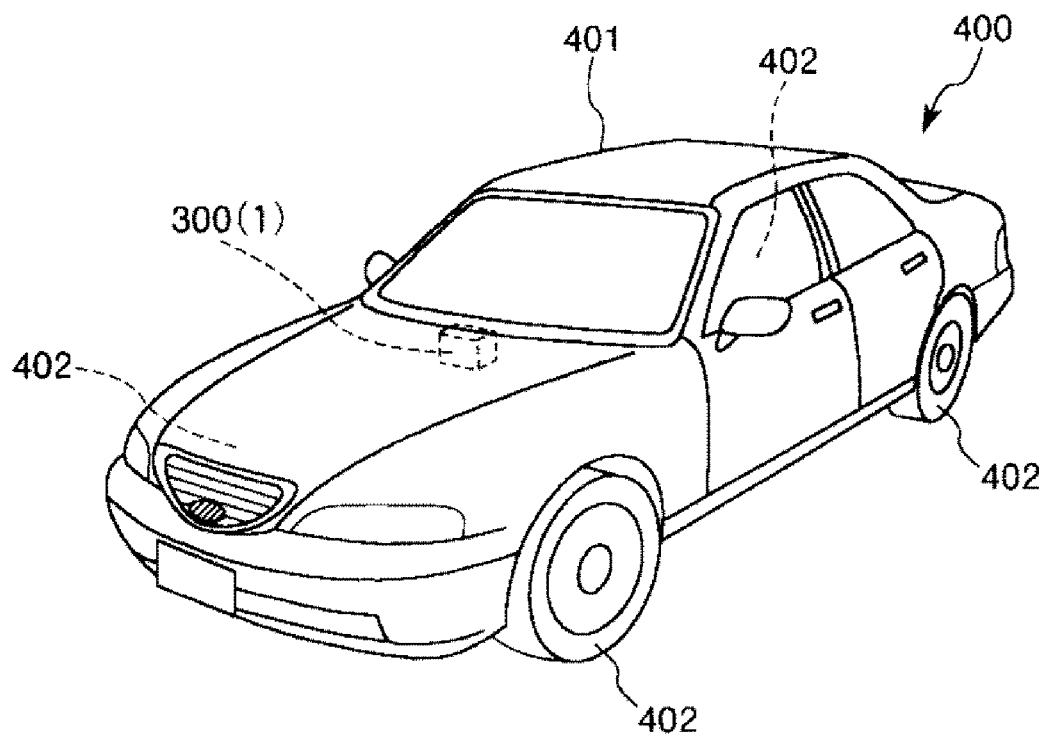
FIG. 12 is a perspective view illustrating an example of a moving object according to the invention.

Next, a moving object to which the physical quantity sensor according to the invention is applied (moving object according to the invention) will be described. FIG. 12 is a perspective view illustrating an example of the moving object according to the invention.

A moving object 400, as illustrated in FIG. 12, includes a vehicle body 401 and four wheels 402 and is configured to rotate the wheels 402 with an unillustrated drive source (engine) that is disposed in the vehicle body 401. The navigation system 300 (physical quantity sensor 1) is incorporated into such a moving object 400.

While the electronic device, the physical quantity sensor, the pressure sensor, the vibrator, the altimeter, the electronic apparatus, and the moving object according to the invention are described thus far on the basis of each illustrated embodiment, the invention is not limited to those embodiments. Configurations of each unit can be substituted by an arbitrary configuration that has the same function. In addition, other arbitrary constituents may be added.

While the above embodiments are described in the case where the number of piezoresistive elements (functional elements) disposed in one diaphragm portion is four, the invention is not limited to this. For example, the number of piezoresistive elements may be greater than or equal to one and less than or equal to three or may be greater than or equal to five. In addition, the arrangement, shape, and the like of the piezoresistive elements are not limited to the above embodiments. For example, the piezoresistive elements may also be arranged in the central portion of the diaphragm portion in the above embodiments.

While the above embodiments are described in the case where the piezoresistive elements are used as a sensor element that detects bending of the diaphragm portion, the invention is not limited to this. For example, such an element may be a resonator.

While the above embodiments are described in the case where the resonator that the vibrator is provided with includes a plurality of movable portions, the invention is not limited to this. The number of movable portions may be greater than or equal to one and less than or equal to three or may be greater than or equal to five.

The electronic device according to the invention is not limited to the physical quantity sensor and the vibrator. The invention can be applied to various electronic devices in which a wall portion and a ceiling portion are formed on a substrate by using a semiconductor manufacturing process and in which an inner space is formed by the substrate, the wall portion, and the ceiling portion.

What is claimed is:

1. An electronic device comprising:
a substrate;
a functional element that is arranged on one face side of the substrate;
a wall portion that is arranged to surround the functional element on the one face side of the substrate in a plan view of the substrate; and
a ceiling portion that is arranged on the opposite side of the wall portion from the substrate and constitutes an inner space with the wall portion,
wherein the ceiling portion includes
a first layer that includes a through hole, and
a second layer that is stacked on the first layer on the opposite side of the first layer from the substrate and closes an opening portion of the through hole, the second layer in which at least a part of the outer periphery of a contact portion where the second layer is in contact with the first layer is on the outside of the inner space in a plan view.

2. The electronic device according to claim 1, further comprising:
an insulating layer that has a part which is arranged between an outer peripheral portion of the first layer and an outer peripheral portion of the second layer.

3. The electronic device according to claim 1,
wherein the ceiling portion includes
a first material that is included in the wall portion, and
a second material of which the thermal expansion rate is smaller than the thermal expansion rate of the first material.

4. The electronic device according to claim 1,
wherein the inner periphery of an end portion of the wall portion that is on the ceiling portion side of the wall portion includes a corner portion, and
at least a part of the outer periphery of the contact portion that corresponds to the corner portion is arranged on the outside of the inner space in a plan view.

5. The electronic device according to claim 1,
wherein the substrate includes a diaphragm portion that is disposed at a position where the diaphragm portion overlaps with the ceiling portion in a plan view and that is deformed in a flexural manner by the reception of pressure, and
the functional element is a sensor element that outputs an electrical signal from strain.

6. A physical quantity sensor comprising:
a substrate that includes a diaphragm portion which is deformed in a flexural manner by the reception of pressure;
a sensor element that is arranged on one face side of the diaphragm portion;
a wall portion that is arranged to surround the sensor element on the one face side of the substrate in a plan view of the substrate; and
a ceiling portion that is arranged on the opposite side of the wall portion from the substrate and constitutes an inner space with the wall portion,
wherein the ceiling portion includes
a first layer that includes a through hole, and
a second layer that is stacked on the first layer on the opposite side of the first layer from the substrate and closes an opening portion of the through hole, the second layer in which at least a part of the outer periphery of a contact portion where the second layer is in contact with the first layer is on the outside of the inner space in a plan view.

7. An electronic apparatus comprising:
the electronic device according to claim 1,
a casing that accommodates the electronic device, and
an operation unit that processes a signal obtained from the electronic device.

8. An electronic apparatus comprising:
the physical quantity sensor according to claim 6,
a casing that accommodates the physical quantity sensor, and
an operation unit that processes a signal obtained from the physical quantity sensor.

\* \* \* \* \*